United States Patent [19]

Lipner

[11] Patent Number: 5,319,579
[45] Date of Patent: Jun. 7, 1994

[54] SIMULATION OF HUMAN PERFORMANCE OF A PROCESS OPERATION PROCEDURE

[75] Inventor: Melvin H. Lipner, Monroeville, Pa.

[73] Assignee: Westinghouse Electric Corp., Pittsburgh, Pa.

[21] Appl. No.: 474,896

[22] Filed: Feb. 5, 1990

[51] Int. Cl.$^5$ .............................................. G06F 15/60
[52] U.S. Cl. ................... 364/578; 364/551.01; 395/500; 395/1
[58] Field of Search ................ 364/578, 551.01, 513, 364/401; 395/500, 1

[56] References Cited

U.S. PATENT DOCUMENTS

| | | | |
|---|---|---|---|
| 4,472,770 | 9/1984 | Li | 364/148 |
| 4,796,194 | 1/1989 | Atherton | 364/149 |
| 4,803,039 | 2/1989 | Impink, Jr. et al. | 364/188 |
| 4,803,641 | 2/1989 | Hardy et al. | 364/900 |
| 4,815,014 | 3/1969 | Lipner et al. | 364/188 |
| 4,939,683 | 7/1990 | Van Heerden et al. | 364/715.11 |
| 4,977,529 | 12/1990 | Gregg et al. | 364/578 |
| 5,140,537 | 8/1992 | Tullis | 364/578 |

OTHER PUBLICATIONS

Lewis; "Comparing Subject Strategis at a Process at a Process Control Task"; IEEE 1989.
Tauton; "A Rule Based Supervisory Control System"; IEEE Nov. 29, 1985.
Levary et al; "Hybrid Expert Simulation"; Expert Systems, May 1988 vol. 5, No. 2.
Leinweber; "Knowledge-Based Systems for Financial Applications"; IEEE Expert 1988.

Primary Examiner—Jack B. Harvey
Assistant Examiner—Ellis B. Ramirez
Attorney, Agent, or Firm—J. C. Valentine

[57] ABSTRACT

A system for simulating human performance of a predefined procedure for operating equipment uses operator characteristics defining how human operator performance will be simulated. The operator characteristics include at least one among decision making rules, execution accuracy rules and rules defining operator response speed. The rules are weighted by a probability function having a randomized factor to produce a specified result a given percentage of the time when the simulation is repeated using the same operator characteristics. The results of the simulation are recorded and analyzed to evaluate performance of a human operator having the defined operator characteristics.

23 Claims, 4 Drawing Sheets

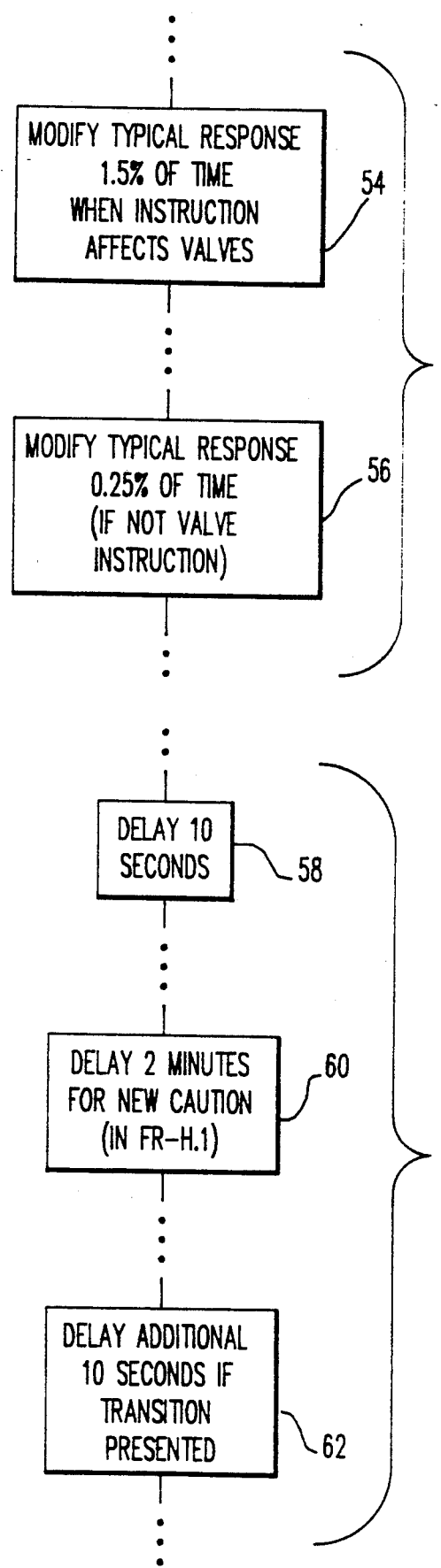

SIMULATION OF HUMAN PERFORMANCE OF A PROCESS OPERATION PROCEDURE

BACKGROUND OF THE INVENTION

1. Field of the Invention

The present invention is directed to a computer simulation of human performance of a procedure and, more particularly, to the simulation of a procedure for operating equipment, such as an electrical power plant.

2. Description of the Related Art

Software for monitoring the execution of complex plant operating procedures has been available for several years. One example of such software is COMPRO available from Westinghouse Electric Corporation. The principles used in COMPRO and similar software products are disclosed in U.S. Pat. Nos. 4,803,039 and 4,815,014 and U.S. patent application Ser. No. 07/307,831, all incorporated herein by reference. The man-machine interface for such software is designed to minimize potential errors in execution of the procedure. Both errors of omission and commission common in following printed procedures are addressed in the design of such software.

Due to the design of the man-machine interface, errors are less likely to occur when a human operator uses such software, rather than conventional printed operational procedures. If not for this fact, such software could be used for evaluating the quality of the procedure itself.

Some versions of such software are used in only a small percentage of the plants which could benefit from the use of such software. In many cases, operating procedures at plants not using such software are virtually identical to the procedures for plants using such software. As a result, the plants not using such software could benefit from the evaluation of the procedure itself, which is difficult with a human operator due to the difference between the man-machine interface of the software and the way in which the printed procedures are used. If such software could be used for evaluation of the procedures, the results of the evaluation would be helpful at all locations where the procedures are used, whether the procedures are available in a computer based monitoring system or only in printed form.

SUMMARY OF THE INVENTION

An object of the present invention is to provide computer simulation of a human operator performing a predefined procedure.

Another object of the present invention is to provide a computer simulation of a human operator capable of evaluating how variations in human factors affect plant operations.

Yet another object of the present invention is to provide computer simulation of a human operator capable of wide variation in multiple characteristics of human performance of a procedure.

The above objects are attained by providing a method for simulating human operator performance of a predefined procedure, comprising the steps of: storing the predefined procedure; defining operator characteristics; and simulating human performance of the predefined procedure in dependence upon the operator characteristics. Preferably, the operator characteristics include at least one decision making rule, at least one execution accuracy rule and at least one rule defining operator response speed. Each of the operator characteristics is preferably weighted by a probability function. The particular probability function used can be different for each operator characteristic. A typical probability function can be one which randomly provides a specified response a given percentage of the time. Such probability functions may be applied when a specific step or type of step is reached or when nonsequential procedural information, such as cautions, are generated by a computer-based monitoring system.

These objects, together with other objects and advantages which will be subsequently apparent, reside in the details of construction and operation as more fully hereinafter described and claimed, reference being had to the accompanying drawings forming a part hereof, where like reference numerals refer to like parts throughout.

BRIEF DESCRIPTION OF THE DRAWINGS

FIGS. 3A-3C illustrate portions of each of the blocks illustrated in FIG. 2.

DESCRIPTION OF THE PREFERRED EMBODIMENTS

Figure 1:
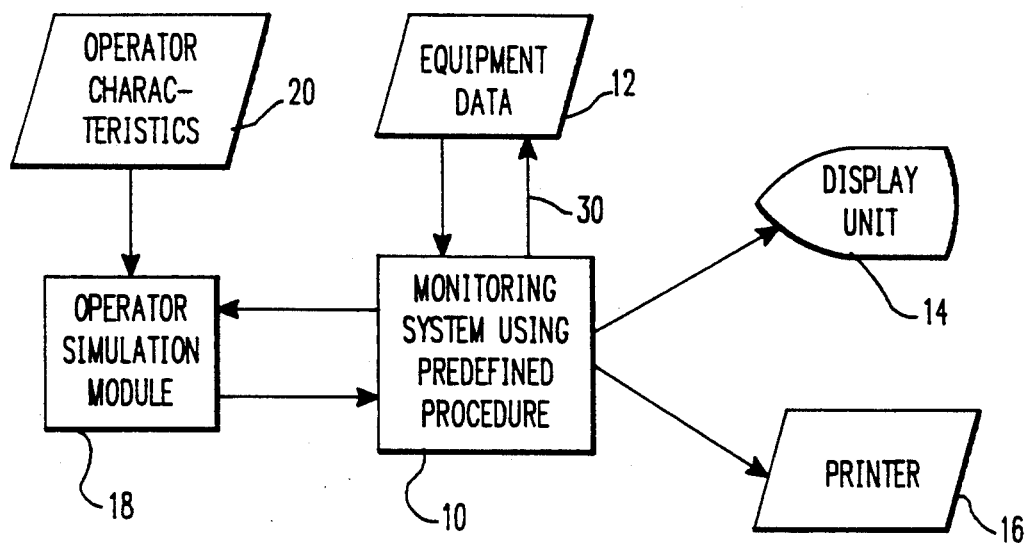
FIG. 1 is a block diagram of an apparatus according to the present invention.

Depending upon the complexity of the procedure, virtually any properly programmed computer system can be used in implementing the present invention. A block diagram of such a system is illustrated in FIG. 1. A predefined procedure for operating equipment is stored in machine readable form to enable the computer system to operate as described in U.S. Pat. Nos. 4,803,039 and 4,815,014. A monitoring system 10 receives equipment data 12 which is applied to the predefined procedure. Ordinarily, the equipment data 12 is supplied from a data acquisition system in, e.g., an electrical power plant, chemical process plant or other installation of complex machinery. While the same source can be used during evaluation of human performance of the predefined procedure, during simulation the equipment data 12 is preferably supplied from a record of actual equipment performance, a simulator of the equipment or other source of synthetic data.

According to the present invention, in addition to supplying procedure data in, for example, a conventional manner to a display unit 14 and printer 16, the monitoring system 10 also supplies procedure data to an operator simulation module 18. If the operator simulation module 18 is a program running on the same computer system as the monitoring system 10, the procedure data may simply be obtained by the operator simulation module from arrays and other data storage elements used by the monitoring system 10 to record the procedure information output to the display unit 14. Alternatively, the information which would ordinarily be displayed to a human operator may be supplied to a separate computer system executing the operator simulation module 18. In either case, the monitoring system 10 identifies steps of the predefined procedure in dependence upon the equipment data 12.

For example, the predefined procedure used by the monitoring system 10 may be the cold startup of a nuclear reactor and the equipment data 12 may be a record of sensor data generated during an actual cold startup or a plant simulator running a simulation of the cold startup of a reactor. The monitoring system 10 will move through the steps of the procedure as the equipment data 12 indicates that the state of the nuclear reactor has changed and in dependence upon responses received from the operator simulation module 18.

The operator simulation module 18 relies upon user defined operator characteristics 20 to determine how to respond to the procedure data. In the preferred embodiment, the operator characteristics fall into three broad categories. The first category includes decision making rules. Errors related to faulty decision making are cognitive errors, i.e., errors involving misjudgment. There are several ways in which decision making rules could be implemented. For example, if it is believed, either through experience or guesswork, that in certain situations errors will be made a certain percentage of the time, decision making rules can be written with a percentage error rate incorporated by applying a probability function containing a randomized factor weighted to produce the desired error rate during multiple simulation runs.

The situation encoded in the decision making rules may involve a specific step, e.g., whether to take an action required by a step identified by number in the procedure. Another decision making rule may affect a class of steps, such as all steps related to a transition from one step to a nonsequential step, following a caution violation. Such a rule may indicate whether to take the transition required by the caution violation, or to continue the procedure. The transition may be to another step within the same procedure or to a completely different procedure. Such transitions are generally dependent upon plant conditions at the time that the caution violation occurs. Many other types of decision making rules can be included, as obvious to one of ordinary skill in the art.

The second category of operator characteristics include execution accuracy rules. These rules recognize that humans make mistakes even though they know the correct action to take. The number of execution accuracy rules is likely to be less than the number of decision making rules and is likely to be influenced by the type of interface assumed between the human operator and the predefined procedure. For example, when it is assumed that a sophisticated interface, like COMPRO, provides information regarding the procedure to the user, the number of execution errors is likely to be much less than if the operator simulation module 18 is being used to evaluate the use of a written procedure.

The third category of operator characteristics involves rules defining operator response speed. As in the case of execution accuracy, the number of rules defining operator response speed may be much simpler than the decision making rules. A single amount of average delay time may be applied to all responses. This delay time may be weighted by a probability function, such as functions which result in a normal distribution, a Poisson distribution or other known distribution of random events. In addition, the rules for defining operator response speed may define a different speed of response for specific steps, types of steps, or other information intended to be supplied by the predefined procedure to a human operator being simulated by the operator simulation module 18.

For example, a caution is a constraining condition applicable to a plurality of sequential instructions or conditions, as described in more detail in U.S. patent application Ser. No. 07/307,831. The rules defining operator response speed may increase the delay upon receipt of information from the predefined procedure indicating that a caution has been displayed on the display unit 14, or would have been displayed if a human operator was interacting with the monitoring system 10. Furthermore, the amount of delay in response to a caution may vary depending upon the particular caution which is displayed. The operator response speed also may be defined as including an additional delay, beyond the usual delay for any other caution, when a caution containing lengthy text or information having a high level of importance is to be displayed by the monitoring system 10.

Figure 2:
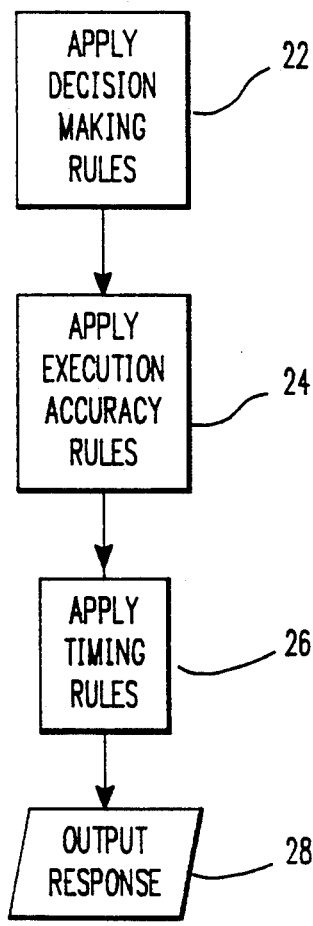
FIG. 2 is a general flowchart for applying basic operator characteristics.

Once a user, i.e., a person evaluating human performance of the predefined procedure, has defined the operator characteristics 20, human performance of the predefined procedure can be simulated in dependence upon the operator characteristics. The simulation is begun by initiating execution of the monitoring system 10 and the operator simulation module 18. If a plant simulator, or tape containing actual plant data is used, the source of equipment data 12 is also started. The operator simulation module 18 then begins following the steps in the flowchart illustrated in FIG. 2 based upon the procedure data obtained from the monitoring system 10. First, decision making rules are applied 22, and then the execution accuracy rules are applied 24. Finally, the timing rules are applied 26. The result is a timed response 28 which is supplied to the monitoring system 10. This response is operated upon by the monitoring system as if it had been received by a human operator, including requesting a change in equipment operating condition, as indicated by the arrow 30 in FIG. 1.

Figure 3A:
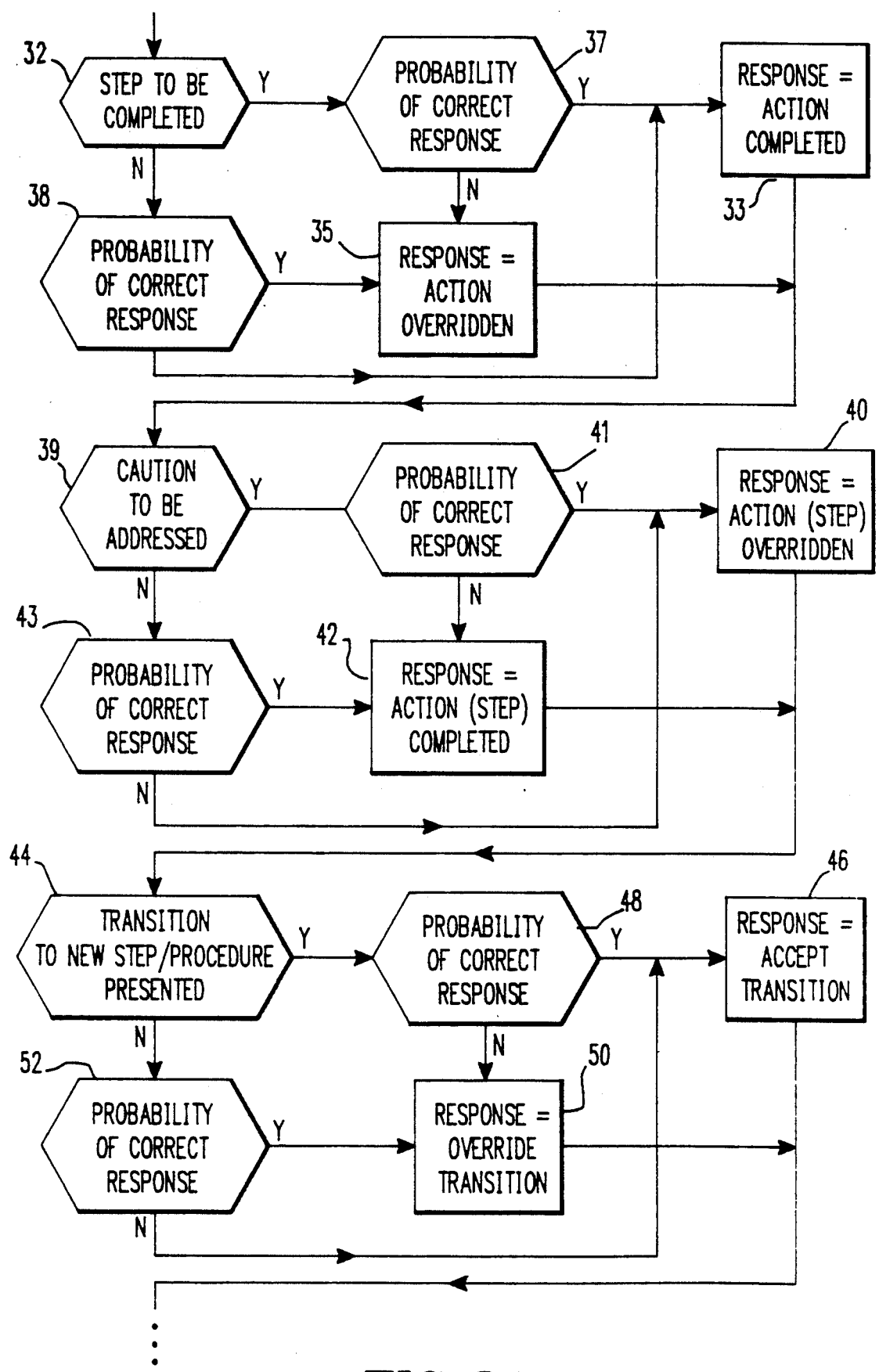
Figure 4:
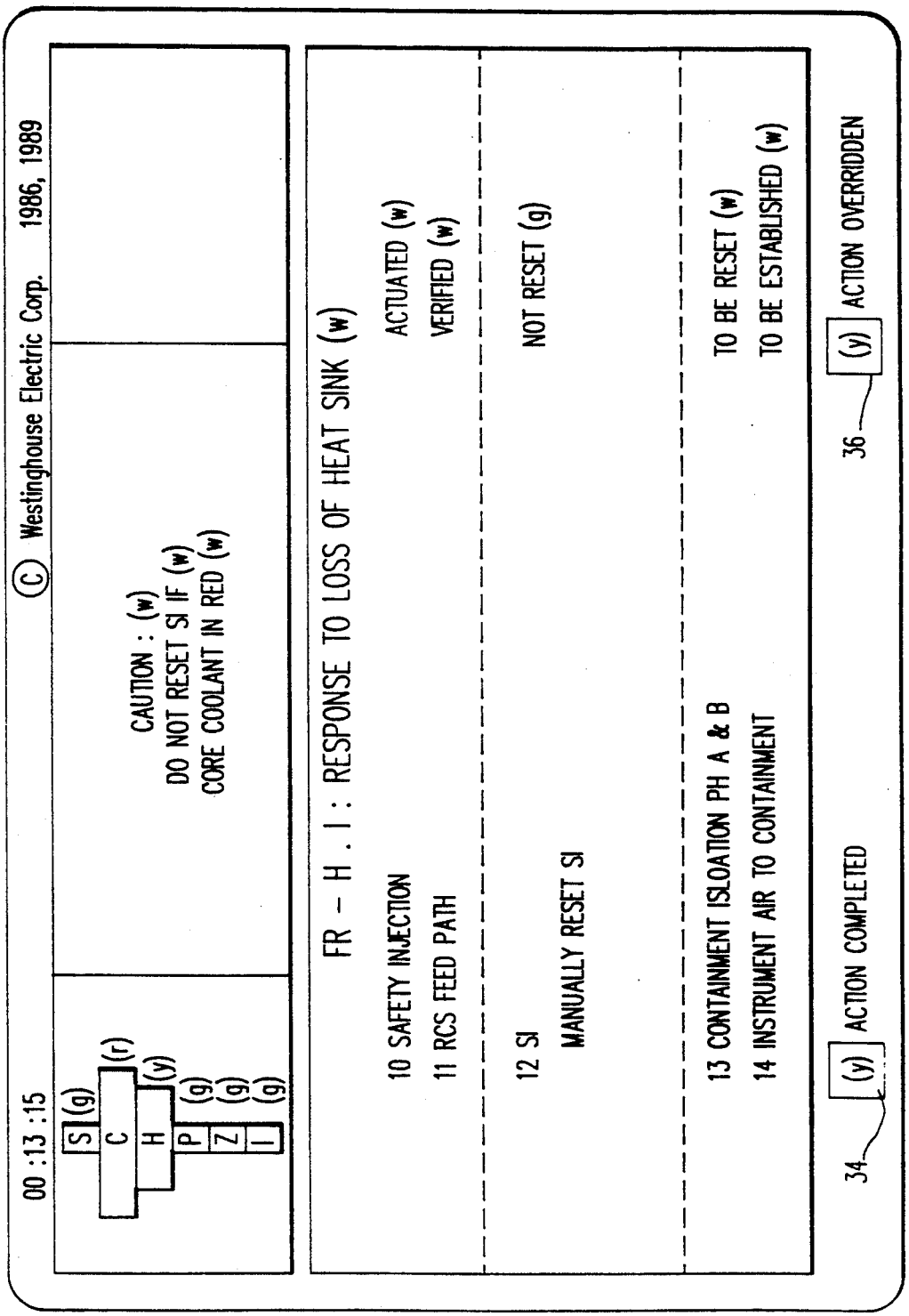
FIG. 4 is an example of a screen displayed during simulation of an operator.

An example of the application of defined operator characteristics is illustrated in FIGS. 3A-3C. Assuming the information obtained from the monitoring system 10 by the operator simulation module 18 is that the screen illustrated in FIG. 4 is (or would be) displayed on display unit 14, the decision rules applied in step 22 may include the program flow illustrated in FIG. 3A. The lower case letters in parentheses in FIG. 4 indicate colors used for the preceding text. Other steps may also be performed as indicated by the ellipses at the top and bottom of FIG. 3A. Regardless of what other rules may be evaluated, the decision making rules are likely to include opting 32 for completion of a step and thereby assigning 33 a value indicating that the procedure is to be continued if the step has been completed. This response is the same as a human operator pressing the ACTION COMPLETED button 34 in FIG. 4. If the decision in step 32 is to indicate that the step is not to be completed, the response ACTION OVERRIDDEN is assigned 35. This response is the same as a human operator pressing the ACTION OVERRIDDEN button 36 in FIG. 4.

As indicated by the tests 37 and 38, the proper responses are assigned 33, 35 only if a probability function determines that the response, which should be indicated according to the rules applied in step 32, actually will be indicated. FIG. 3A illustrates the probability function weighting the responses, i.e., separate steps after the decision is made in step 32. Alternatively, the probability function can be an integral part of the decision made in step 32 to opt for completion of a step, when the probability function determines that an incorrect decision is to be made, the route taken out of the decision step 32 is different. As is apparent from FIG. 3A, the result is the same in either embodiment, i.e., the correct response will be indicated provided the probability function does not determine that the incorrect response could be indicated. One of the advantages of the embodiment illustrated in FIG. 3A, is that the probability function used for the response "ACTION COMPLETED" can be different from the probability function used for "ACTION OVERRIDDEN". Thus, if it is suspected that operators tend to automatically complete the action without carefully determining that the action should not be overridden, the probability of correct response in step 38 can be set to produce a larger number of errors than the probability of correct response in step 37.

Another rule that might be included is to opt 39 to address a caution or a caution violation. If this decision on the option is affirmative, the response will be assigned 40 an indication that the current step should be overridden, so as to allow for the immediate handling of the caution violation. This is equivalent to a human operator depressing the ACTION OVERRIDDEN button 36 in FIG. 4.

In the example illustrated in FIG. 3A, the response ACTION OVERRIDDEN is assigned 40 only if the probability function is evaluated 41 to produce the correct response. If the evaluation 41 of the probability function results in production of an incorrect response or a decision is made 39 not to address a caution violation, the response ACTION COMPLETED is assigned 42, unless another probability function is evaluated 43 to assign 40 the response ACTION OVERRIDDEN to the response. Alternatively, the result of a decision in either of steps 39 and 41 to not assign 40 the response ACTION OVERRIDDEN could be to assign no response at all, thereby allowing the response to be decided by other rules, such as the decision 32 to complete the step.

Another test which is likely to be included in the decision making rules is whether the option available to the operator includes a transition 44 to a new step or procedure. A rule might state that the response should indicate 46 that the transition is accepted. As in the other rules illustrated in FIG. 3A, the response assigned in step 46 is weighted 48 by a probability function which otherwise causes OVERRIDE TRANSITION to be assigned 50 to the response. This latter response is also produced if a decision 44 is made to not perform the transition and another probability function is evaluated 52 to produce that response.

As discussed above, any of the assignment steps 33, 40 and 46 may be modified by a probability function. The probability function may be a simple as producing the response 98 percent of the time using a random number generator, or as specific as producing the response only 50 percent of the time if the current step is number 12 in FR-H.1, as illustrated in FIG. 4. In the latter case, the correct response indicated by step 40 would not be made 50 percent of the time due to the probability function evaluated in step 41.

As noted above, there may be several execution accuracy rules 24 and timing rules 26. For example, an execution rule modifying 54 the typical affirmative response 1.5 percent of the time when the instruction in the current step affects valves, could be included in the execution accuracy rules 24. Also, a general rule, such as modifying 56 the usual response 0.25 percent of the time, might be included. If both steps 54 and 56 are included in the execution accuracy rules, an additional provision may be added to step 56 so that the response is modified 0.25 percent of the time only if the current step is not a valve instruction. Alternatively, branching can be provided between steps 54 and 56 to attain the same result. Also, it would be possible to allow step 56 to further modify the response output by step 54.

Examples of timing rules are illustrated in FIG. 3C. One rule might provide a typical delay 58 of ten seconds. Another rule might add an additional two minute delay 60 when a caution is first displayed. Such timing rules may be specific to a group of steps, such as all sequential instructions in procedure FR-H.1. Similarly, an additional delay 62 might be added when a transition is presented. After the total delay, the response is output 28 to the monitoring system 10.

The monitoring system 10 processes the response as if it had been received from a human operator and modifies the instructions displayed on the display unit 14 in dependence upon the responses contained in decision data received from the operator simulation module and the equipment data 12. The simulation of human performance of the predefined procedure continues as the monitoring system 10 automatically identifies new steps of the predefined procedure in dependence upon the equipment data and the decision data.

During the simulation, procedure data indicating the steps identified by the monitoring system 10 may be displayed on display unit 14 and may also be output to the printer 16. In addition, the responses, as represented by the decision data, are preferably also recorded on the printer 16 to indicate the response obtained from the operator simulation module. If the equipment data 12 is obtained from a disk file, or some other storage unit is connected to the monitoring system 10, the responses can be recorded on the same disk or in that storage unit. Regardless of how the responses are recorded, after the simulation is completed the responses may be analyzed to evaluate how the particular set of operator characteristics 20 affected the operation of the equipment. The simulation may be repeated with or without changes to the operator characteristics 20. If the probability function used to weight any of the operator characteristics is anything other than 0 percent or 100 percent, it can be expected that there will be variations in the results obtained. In addition, the simulation may be repeated after making changes in the operator characteristics 20. Preferably, both the procedure data and the responses produced by the operator simulation module 18 are recorded, together with additional decision data indicating the reason why the response was obtained. In the example illustrated in FIGS. 3A and 4, if the response was ACTION COMPLETED, the decision data would include an indication that it was determined in step 39 to address the caution, but due to the weighting 41 of the probability function, step 40 was not executed.

As noted above, in a preferred embodiment of the present invention the decision data containing the response produced by the operator simulation module 29 can be supplied to the source of the equipment data 12, as indicated by arrow 30. Thus the simulation of equipment operation can be performed in dependence upon the decision data, providing a more accurate simulation of how the operator characteristics affect the operation of the equipment.

The many features and advantages of the present invention are apparent from the detailed specification, and thus it is intended by the appended claims to cover all such features and advantages of the system which fall within the true spirit and scope of the invention. Further, since numerous modification and changes will readily occur to those skilled in the art from the disclosure of this invention, it is not desired to limit the invention to the exact construction and operation illustrated and described, accordingly, suitable modifications and equivalents may be resorted to, all falling within the scope and spirit of the invention.

What is claimed is:

1. A method for evaluating human operator performance of a predefined procedure, comprising the steps of:
   (a) storing the predefined procedure;
   (b) defining operator characteristics;
   (c) simulating human performance of the predefined procedure in dependence upon the operator characteristics defined in step (b) using a data processing apparatus; and
   (d) evaluating human performance of the predefined procedure based on said simulating in step (c) using a data processing apparatus.

2. A method as recited in claim 1, wherein said defining in step (b) includes at least one of the substeps of:
   (b1) defining at least one decision making rule;
   (b2) defining at least one execution accuracy rule;
   (b3) defining operator response speed.

3. A method as recited in claim 2, wherein said defining in at least one of the substeps (b1), (b2) and (b3) includes weighting the operator characteristics defined therein by a probability function.

4. A method as recited in claim 3, Wherein all of the substeps (b1), (b2) and (b3) are included in said defining in step (b).

5. A method as recited in claim 3, wherein said defining in at least one of the substeps (b1), (b2) and (b3) includes defining an operator response to at least one specific step of the predefined procedure.

6. A method as recited in claim 5, wherein the at least one specific step includes all steps of a specified type in the predefined procedure.

7. A method as recited in claim 6,
   wherein said storing in step (a) includes storing transitions from one step to a nonsequential step of the predefined procedure, and
   wherein said defining in step (b1) includes defining the operator response to at least one of the transitions, including overriding the at least one of the transitions, in dependence upon said weighting by the probability function.

8. A method as recited in claim 3, wherein said defining in at least one of the substeps (b1), (b2) and (b3) includes defining at least one of the operator characteristics in dependence upon the level of importance of a condition controlled by execution of the predefined procedure.

9. A method as recited in claim 3, wherein said defining in substep (b3) includes defining the operator response speed in dependence upon information intended to be supplied by the predefined procedure to a human operator being simulated in step (c).

10. A method as recited in claim 3,
    wherein said storing in step (a) includes storing sequential instructions and constraining conditions, each constraining condition applicable to a plurality of the sequential instructions, and
    wherein said defining in at least one of the substeps (b1), (b2) and (b3) includes defining the operator characteristics applied in response to receiving information from the predefined procedure on at least one of the constraining conditions.

11. A method as recited in claim 3,
    wherein said simulating in step (c) produces responses, and
    wherein said evaluating in step (d) comprises the steps of:
    (d1) recording the responses produced by said simulating in step (c); and
    (d2) analyzing the responses recorded in step (d1).

12. A method as recited in claim 11,
    wherein the probability function in said defining in the at least one of the substeps (b1), (b2) and (b3) includes a randomized factor,
    wherein said method further comprises the step of (f) repeating said simulating in step (c); and
    wherein said recording in step (d1) is performed for each repetition of said simulating in step (c).

13. A method as recited in claim 11,
    wherein said method further comprises the step of (e) repeating said defining in step (b) and said simulating in step (c), each repetition of said simulating in step (c) corresponding to the operator characteristic defined in step (b) for a corresponding repetition of step (b), and
    wherein said recording in step (d1) is performed for each repetition of said simulating in step (c).

14. A method as recited in claim 11,
    wherein said storing in step (a) includes storing the predefined procedure for operating equipment,
    wherein said method further comprises the steps of:
    (e) receiving equipment data representing condition of the equipment;
    (f) automatically identifying steps of the predefined procedure in dependence upon the equipment data; and
    (g) recording procedure data indicating the steps identified in step (f), and
    wherein said analyzing in step (d2) includes analyzing the procedure data recorded in step (g).

15. A method as recited in claim 14, further comprising the steps of:
    (h) simulating operation of the equipment to produce the equipment data; and
    (i) supplying decision data representing said simulating of human performance in step (c),
    wherein said simulating of equipment operation in step (h) is performed in dependence upon the decision data, and
    wherein said simulating of human performance in step (c) is performed in dependence upon the procedure data.

16. A computer implemented method for evaluating human operator performance of a predefined procedure for operating equipment, comprising the steps of:
    (a) storing the predefined procedure, including sequential instructions and constraining conditions, each constraining condition applicable to a plurality of sequential instructions;
    (b) defining operator characteristics, including at least one decision making rule, at least one execution accuracy rule and operator response speed, with weighting of each of the operator characteristics buy a probability function;

(c) receiving equipment data representing condition of the equipment;

(d) automatically producing procedure data identifying steps of the predefined procedure in dependence upon the equipment data;

(e) simulating human performance of the predefined procedure to produce response in dependence upon the operator characteristics defined in step (b) and the procedure data produced in step (d);

(f) repeating steps (b)-(e) to produce the responses in dependence upon any changes made in the operator characteristics defined in step (b) and variation due to the probability function used to weight each of the operator characteristics;

(g) recording the procedure data produced by step (d) and the responses produced by said simulating in step (e); and (h) analyzing the responses and the procedure data recorded in step (g) to evaluate human performance of the predefined procedure.

17. A method as recited in claim 16, wherein the probability function for each of the operator characteristics is selected from among a set of probability functions including a randomized function weighted to produce a specific result for a predetermined percentage of a plurality of repetitions, the predetermined percentage ranging between zero percent and 100 percent, inclusive.

18. A method as recited in claim 16, wherein said defining in step (b) includes defining at least one of the operator characteristics as being applied in said simulating in response to receiving information on at least one of the constraining conditions.

19. A method as recited in claim 16,
wherein step (a) includes defining transitions from one step to a nonsequential step, and
wherein said defining in step (b) includes defining an operator response to at least one of the transitions, including overriding the at least one of the transitions in dependence upon the weighting by the probability function.

20. An apparatus for evaluating human operator performance of a predefined procedure, comprising:
procedure means for storing the predefined procedure;
operator characteristic means for defining operator characteristics; and
computer implemented operator simulation means for simulating human performance of the predefined procedure in dependence upon the operator characteristics and for evaluating human performance of the predefined procedure based on the simulating.

21. An apparatus as recited in claim 20, wherein said apparatus evaluates operation of equipment,
wherein said procedure means comprises:
input means for receiving equipment data representing condition of the equipment;
processing means for identifying steps of the predefined procedure in dependence upon the equipment data; and
output means for supplying procedure data indicating the steps identified by said processing means, and
wherein said operator simulation means includes decision means for supplying decision data indicating decisions made in simulating human performance of the predefined procedure.

22. An apparatus as recited in claim 21, further comprising recording means for recording the procedure data and the decision data.

23. An apparatus as recited in claim 22, further comprising display means for displaying steps in the predefined procedure in dependence upon the procedure data and the decision data.

* * * * *